United States Patent
Kanki et al.

(10) Patent No.: US 12,339,696 B2
(45) Date of Patent: Jun. 24, 2025

(54) FLUCTUATING OSCILLATOR AND ROBOT

(71) Applicant: OSAKA UNIVERSITY, Osaka (JP)

(72) Inventors: Teruo Kanki, Osaka (JP); Yasushi Hotta, Osaka (JP)

(73) Assignee: OSAKA UNIVERSITY, Osaka (JP)

( * ) Notice: Subject to any disclaimer, the term of this patent is extended or adjusted under 35 U.S.C. 154(b) by 589 days.

(21) Appl. No.: 17/791,385

(22) PCT Filed: Dec. 21, 2020

(86) PCT No.: PCT/JP2020/047692
§ 371 (c)(1),
(2) Date: Jul. 7, 2022

(87) PCT Pub. No.: WO2021/145155
PCT Pub. Date: Jul. 22, 2021

(65) Prior Publication Data
US 2023/0038563 A1    Feb. 9, 2023

(30) Foreign Application Priority Data

Jan. 16, 2020  (JP) .................................. 2020-005481

(51) Int. Cl.
G06F 1/03     (2006.01)
G06F 1/02     (2006.01)
(Continued)

(52) U.S. Cl.
CPC ............ *G06F 1/0321* (2013.01); *G06F 1/022* (2013.01); *G06F 1/03* (2013.01); *H03B 29/00* (2013.01); *H03K 3/84* (2013.01)

(58) Field of Classification Search
CPC .......... H03K 3/84; G06F 1/0321; G06F 1/03; G06F 1/022; H03B 29/00
See application file for complete search history.

(56) References Cited

U.S. PATENT DOCUMENTS 4,656,428 A * 4/1987 Ishikawa .................. G10H 7/06
84/627
5,404,402 A    4/1995 Sprunk
(Continued)

FOREIGN PATENT DOCUMENTS

JP          7-239837       9/1995
JP          2001-344094    12/2001
(Continued)

OTHER PUBLICATIONS

Notice of Reasons for Refusal issued Oct. 1, 2024 in corresponding Japanese Patent Application No. 2021-570708, with machine English-language translation.

(Continued)

*Primary Examiner* — Ryan Johnson
(74) *Attorney, Agent, or Firm* — Wenderoth, Lind & Ponack, L.L.P.

(57) ABSTRACT

A fluctuating oscillator includes: a processor including a digital circuit, and the processor includes a random variable generation unit that generates a random variable, a lookup table that stores a waveform signal in advance, a computation unit that imparts fluctuation to the waveform signal based on the waveform signal read from the lookup table, the random variable generated by the random variable generation unit, and a pulse signal to be fed back, a threshold discrimination unit that generates a pulse signal by comparing a fluctuating signal output from the computation unit with a predetermined threshold, and a feedback loop that causes the pulse signal to be fed back to the computation unit.

8 Claims, 14 Drawing Sheets

(51) Int. Cl.
*H03B 29/00* (2006.01)
*H03K 3/84* (2006.01)

(56) References Cited

U.S. PATENT DOCUMENTS

| | | |
|---|---|---|
| 2005/0168248 A1 | 8/2005 | Shiung |
| 2011/0068875 A1* | 3/2011 | Hotta .................. H03K 3/0315 331/57 |
| 2018/0254770 A1 | 9/2018 | Kanki et al. |

FOREIGN PATENT DOCUMENTS

| | | |
|---|---|---|
| JP | WO2010/035576 | 4/2010 |
| WO | 2017/033962 | 3/2017 |

OTHER PUBLICATIONS

International Search Report issued Mar. 16, 2021 in International (PCT) Application No. PCT/JP2020/047692.

\* cited by examiner

| a | b | OPERATION PATTERN |
|---|---|---|
| L | L | STOP |
| H | L | RIGHT TURNING |
| L | H | LEFT TURNING |
| H | H | BREAK |

FIG. 14
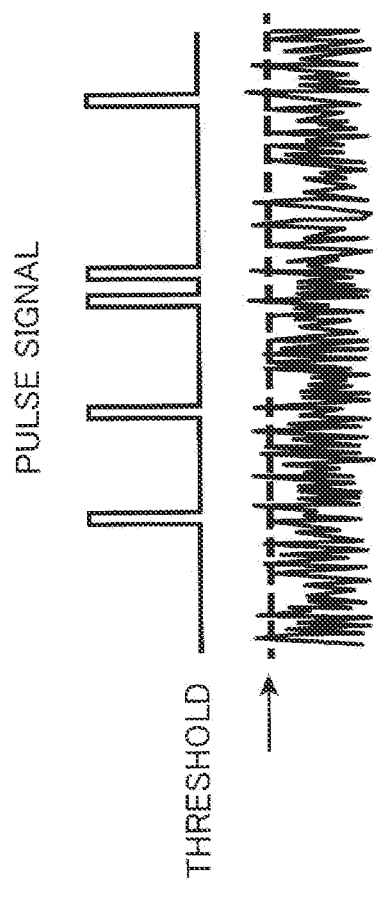
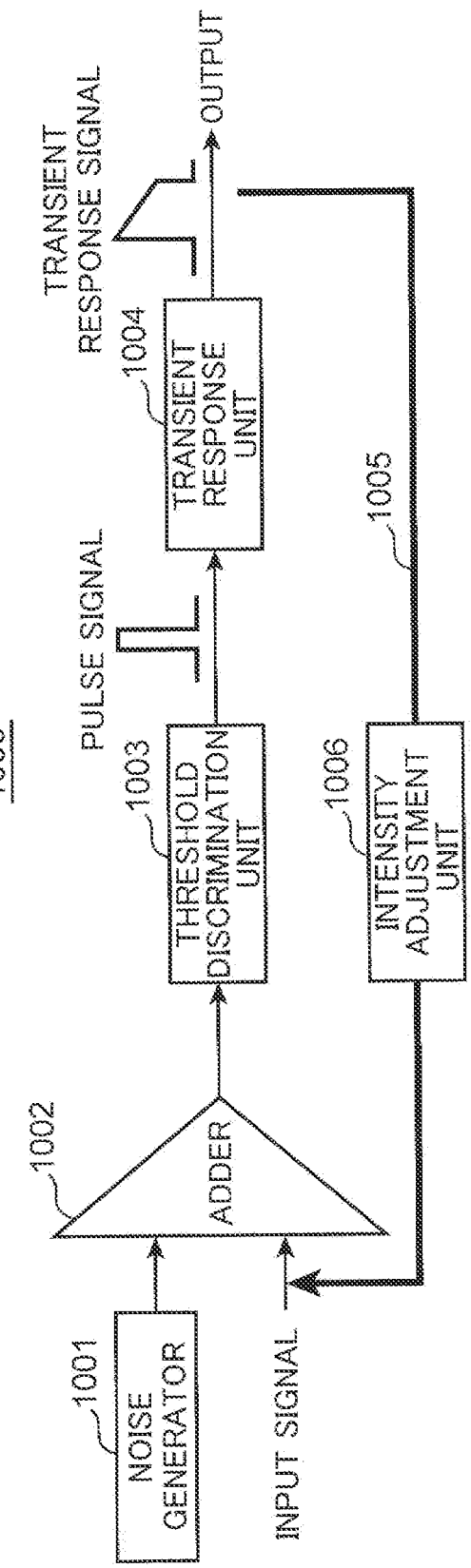

FLUCTUATING OSCILLATOR AND ROBOT

TECHNICAL FIELD

The present invention relates to a fluctuating oscillator and a robot including the fluctuating oscillator.

BACKGROUND ART

There is known a fluctuating oscillator, which is an oscillator using a stochastic resonance phenomenon in which a signal is boosted and a reaction is improved under a certain probability by adding noise to the signal. Since the fluctuating oscillator oscillates with fluctuation such as 1/f fluctuation, it is possible to achieve comfortable control for a human such as flickering a lighting device like a firefly or biologically moving a robot. Furthermore, the fluctuating oscillator can also be used as a sensor that detects a weak signal buried in noise. Since the conventional fluctuating oscillator includes an analog circuit, it has been required to flexibly adjust circuit parameters such as a resistor and a capacitor in order to oscillate the fluctuating oscillator at a desired frequency.

Therefore, Patent Literature 1 discloses a fluctuating oscillator that can flexibly adjust circuit parameters. Specifically, Patent Literature 1 discloses a fluctuating oscillator including a noise generator, an adder that adds, to an input signal, a noise signal generated by the noise generator and a transient response signal to be fed back, a threshold discrimination unit that generates a pulse signal by comparing an addition signal output from the adder with a threshold, a transient response unit that causes transient response of the pulse signal, a feedback loop that feeds back the transient response signal from the transient response unit, and an intensity adjustment unit that adjusts intensity of the transient response signal flowing through the feedback loop.

However, in the fluctuating oscillator described in Patent Literature 1, the transient response signal is generated by the transient response unit including an analog circuit such as a differentiator circuit or an integrator circuit including a resistor and a capacitor. In order to tune this transient response signal to an ideal waveform, it is necessary to change the circuit parameter of the transient response unit to various values, which takes time and effort.

Furthermore, since the transient response unit described in Patent Literature 1 includes a differentiator circuit or an integrator circuit including a resistor and a capacitor, there is a problem that the circuit scale increases. In particular, in order to oscillate the fluctuating oscillator at a low frequency, it is necessary to increase the time constant of the transient response unit, which leads to an increase in circuit scale.

Furthermore, since the fluctuating oscillator described in Patent Literature 1 includes an analog circuit, a noise generator including a function generator and the like is required, and there is room for further improvement in reducing the scale of the circuit configuration.

CITATION LIST

Patent Literature

Patent Literature 1: WO 2017/033962 A

SUMMARY OF INVENTION

An object of the present invention is to provide a fluctuating oscillator and the like that facilitates shaping of a transient response signal, does not require a noise generator, and can achieve reduction in scale of the circuit configuration.

A fluctuating oscillator according to one aspect of the present invention includes: a processor including a digital circuit, in which the processor includes a random variable generation unit that generates a random variable, a lookup table that stores a waveform signal in advance, a computation unit that imparts fluctuation to the waveform signal based on the waveform signal read from the lookup table, the random variable generated by the random variable generation unit, and a pulse signal to be fed back, a threshold discrimination unit that generates a pulse signal by comparing a fluctuating signal output from the computation unit with a predetermined threshold, and a feedback loop that causes the pulse signal to be fed back to the computation unit.

BRIEF DESCRIPTION OF DRAWINGS

FIG. 12 is a view illustrating a logical value table used when a motor driver determines an operation pattern of the robot.

FIG. 14 is a block diagram illustrating a configuration of a conventional fluctuating oscillator.

DESCRIPTION OF EMBODIMENTS

Figure 1:
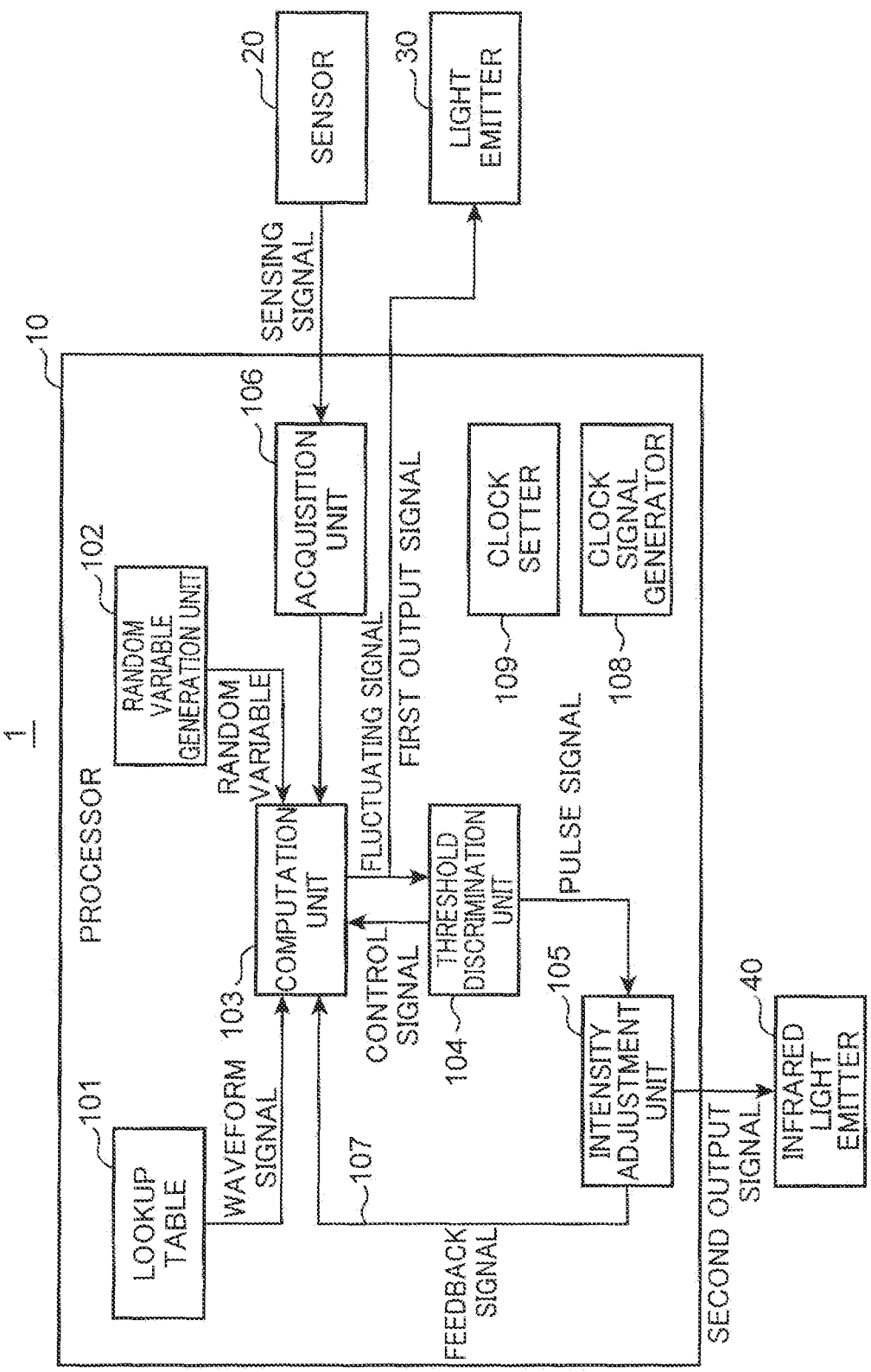
FIG. 1 is a block diagram illustrating an example of a fluctuating oscillator according to a first embodiment.

Embodiments of the present invention will be described below with reference to the accompanying drawings. Note that the following embodiments are examples embodying the present invention and are not intended to limit the technical scope of the present invention.

First, before describing the fluctuating oscillator according to the present embodiment, a conventional fluctuating oscillator will be described. FIG. 14 is a block diagram illustrating the configuration of a conventional fluctuating oscillator 1000. On the upper side of FIG. 14, a waveform chart of a pulse signal output from a threshold discrimination unit 1003 is illustrated. The fluctuating oscillator 1000 includes a noise generator 1001, an adder 1002, a threshold discrimination unit 1003, a transient response unit 1004, a feedback loop 1005, and an intensity adjustment unit 1006. The noise generator 1001 includes a function generator and generates a noise signal. The adder 1002 adds the noise signal generated by the noise generator 1001, an input signal, and a pulse signal flowing through the feedback loop 1005. By adding the noise signal to the input signal, the input signal is imparted with fluctuation.

The threshold discrimination unit 1003 compares an addition signal output from the adder 1002 with a predetermined threshold. If the addition signal exceeds the threshold, a high-level pulse signal is output from the threshold discrimination unit 1003 as illustrated in the waveform chart, and the fluctuating oscillator 1000 enters a high state. If the addition signal falls below the threshold, a low-level pulse signal is output from the threshold discrimination unit 1003 as illustrated in the waveform chart, and the fluctuating oscillator 1000 enters a low state.

The transient response unit 1004 includes a differentiator circuit or an integrator circuit, differentiates or integrates a pulse signal, and outputs a transient response signal. The transient response signal is fed back by the feedback loop 1005 and input to the adder 1002. The intensity adjustment unit 1006 adjusts the intensity of the transient response signal to be fed back, and inputs the signal to the adder 1002.

The fluctuating oscillator 1000 largely oscillates at a natural frequency determined by the intensity of the input signal, the time constant of the transient response unit 1004, the intensity of the transient response signal to be fed back, and the like. However, since the addition signal output from the adder 1002 is given fluctuation by the noise signal, the transmission period fluctuates by 1/f fluctuation, for example. Due to thus, when a robot or a lighting device is controlled using the fluctuating oscillator 1000, comfortable control for humans becomes possible.

Thus, the fluctuating oscillator 1000 includes an analog circuit. Therefore, as described above, there is a problem that it takes time and effort to tune the circuit parameters of the transient response unit 1004 and the circuit scale of the transient response unit 1004 increases. Furthermore, since the fluctuating oscillator 1000 needs the noise generator 1001, there is also a problem that the circuit scale increases accordingly.

Therefore, the present inventor has found that if a fluctuating oscillator includes a processor including a digital circuit, and a waveform signal having a waveform of an ideal transient response signal required in a conventional fluctuating oscillator is stored in advance in a lookup table, the transient response unit becomes unnecessary, and a circuit scale can be reduced. Furthermore, it has been found that if a waveform signal having a waveform of an ideal transient response signal is stored in the lookup table, the troublesome work of adjusting the circuit parameters of the transient response unit 1004 becomes unnecessary. Furthermore, it has been found that since the processor can easily generate a random variable by a program, a large-scale noise generator such as a function generator becomes unnecessary. Based on these findings, the present inventor has conceived of a fluctuating oscillator described below. Hereinafter, the fluctuating oscillator according to the present embodiment will be described with reference to the drawings.

First Embodiment

FIG. 1 is a block diagram illustrating an example of a fluctuating oscillator 1 according to the first embodiment of the present invention. The fluctuating oscillator 1 includes a processor 10, a sensor 20, a light emitter 30, and an infrared light emitter 40.

The processor 10 is a digital circuit including a microcontroller including a CPU and memories such as a RAM and a ROM. The processor 10 includes a lookup table 101, a random variable generation unit 102, a computation unit 103, a threshold discrimination unit 104, an intensity adjustment unit 105, an acquisition unit 106, a feedback loop 107, a clock signal generator 108, and a clock setter 109. The lookup table 101, the random variable generation unit 102, the computation unit 103, the threshold discrimination unit 104, the intensity adjustment unit 105, the acquisition unit 106, and the feedback loop 107 are implemented by the processor 10 executing a program that causes a computer to function as the fluctuating oscillator 1. However, this is an example, and the lookup table 101, the random variable generation unit 102, the computation unit 103, the threshold discrimination unit 104, the intensity adjustment unit 105, the acquisition unit 106, and the feedback loop 107 may be configured by dedicated circuits such as ASIC and FPGA.

The lookup table 101 stores a waveform signal in advance. As the waveform signal, a transient response signal having an ideal shape required for the conventional fluctuating oscillator 1000 can be adopted. For example, the waveform signal has a differentiated waveform that is an output waveform of the differentiator circuit, an integrated waveform that is an output waveform of the integrator circuit, or a logarithmic waveform.

The fluctuating oscillator 1 uses, in a low state, an inverted waveform signal in which a waveform signal used, for example, in a high state is inverted. Therefore, the lookup table 101 stores, as a basic waveform pattern, only the waveform signal used in the high state. This suppresses consumption of the memory resource of the lookup table 101.

The waveform signal stored in the lookup table 101 is a discrete waveform signal in which digital sample values of sample points when a certain waveform is sampled at a predetermined sampling interval are arranged in time series. In the waveform signal stored in the lookup table 101, sample values are sequentially read by the computation unit 103 in synchronization with the clock signal output from the clock signal generator 108.

Figure 2:
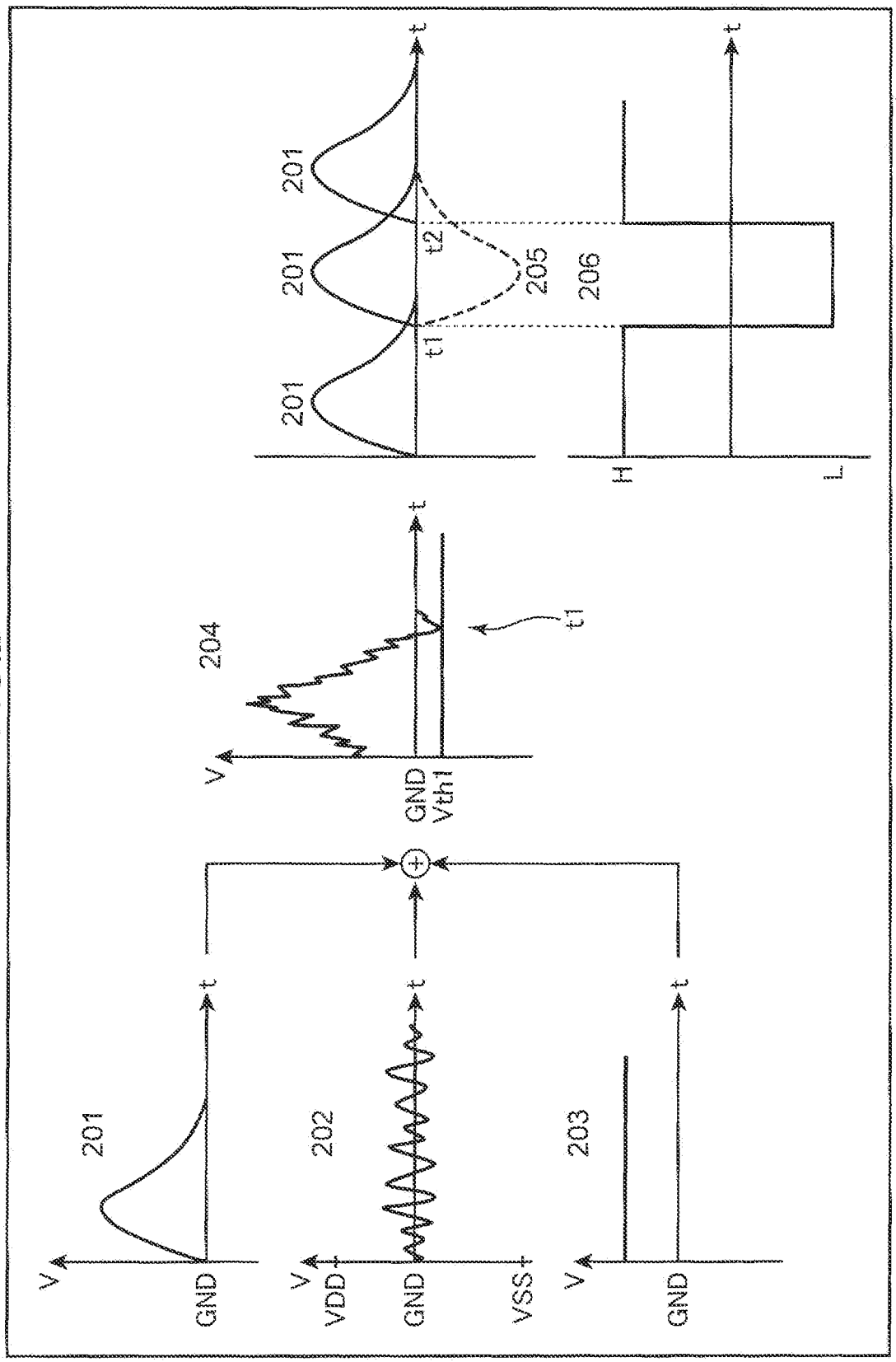
FIG. 2 is a waveform chart explaining an operation of the fluctuating oscillator.

As indicated by a waveform signal 201 in an upper left of FIG. 2, the logarithmic waveform has a rising part that rises from a ground GND toward a peak in a curve convex upward, and an attenuation part that gently attenuates from the peak toward the ground GND in a curve convex downward that is gentler than that of the rising part. The logarithmic waveform is a transient response waveform that is a waveform of an output signal at the time of transient response of an LCR circuit, and has a shape in which a differentiated waveform and an integrated waveform are combined. The LCR circuit is a circuit in which a coil (L), a capacitor (C), and a resistor (R) are connected in series or connected in parallel.

Figure 3:
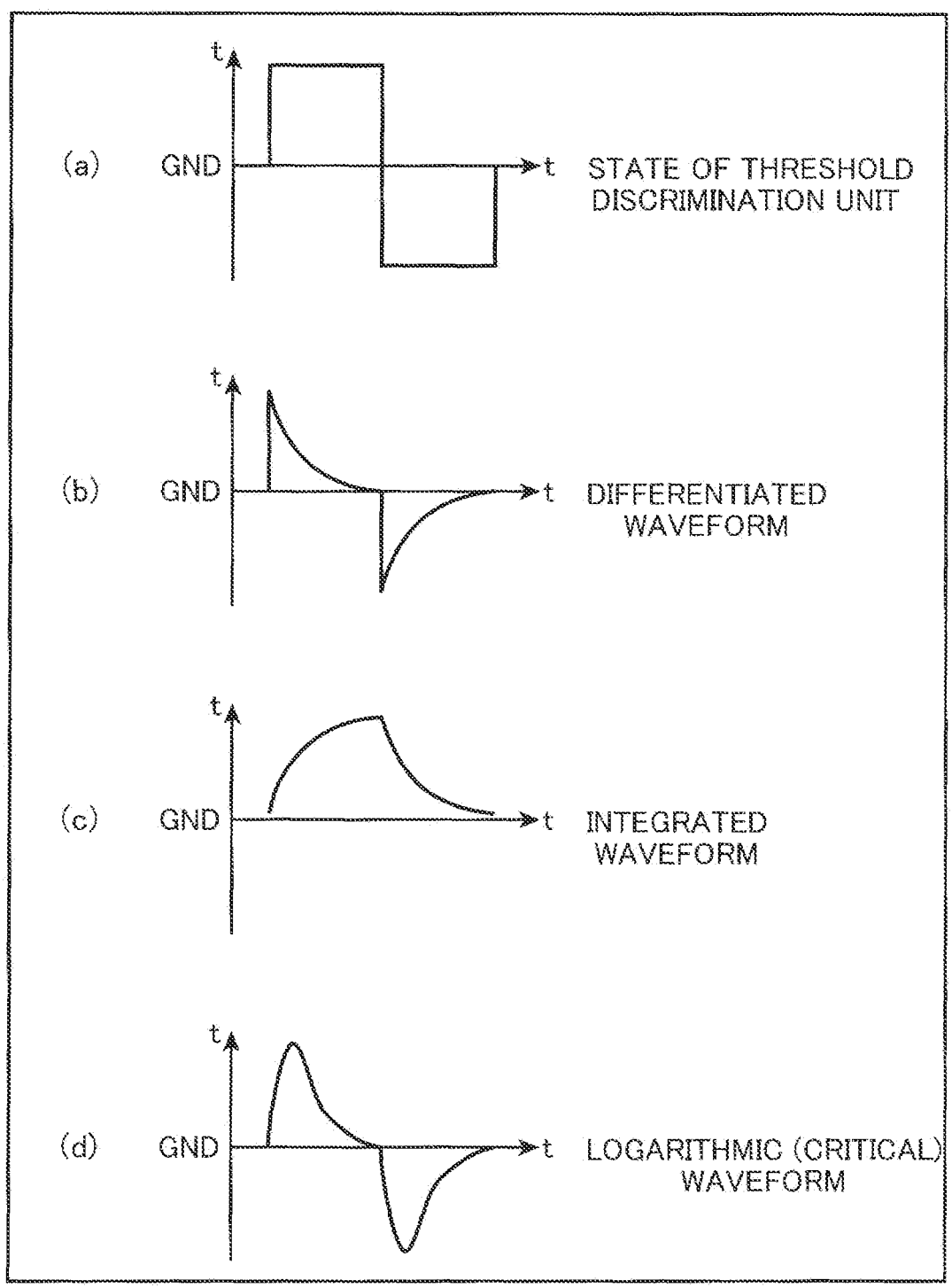
FIG. 3 is a chart illustrating an example of a differentiated waveform, an integrated waveform, and a logarithmic waveform with respect to a state of a threshold discrimination unit.

FIG. 3 is a view illustrating an example of a differentiated waveform, an integrated waveform, and a logarithmic waveform with respect to the state of the threshold discrimination unit 104. In FIG. 3, (a) illustrates the state of the threshold discrimination unit 104, that is, a pulse signal, (b) illustrates the differentiated waveform, (c) illustrates the integrated waveform, and (d) illustrates the logarithmic waveform. In a case where the state of the threshold discrimination unit 104 is the high state, the differentiated waveform has a shape that rises steeply from the ground GND toward the peak in a substantially linear shape and then gently attenuates in a curve convex downward from the peak toward the ground GND. When the state of the threshold discrimination unit 104 becomes the low state, the differentiated waveform has a shape in which the differentiated waveform in the high state is inverted.

In a case where the state of the threshold discrimination unit 104 is the high state, the integrated waveform has a shape gently rising from the ground GND in a curve convex upward. When the state of the threshold discrimination unit 104 becomes the low state, the integrated waveform has a shape in which the integrated waveform in the high state is inverted and head of the inverted integrated waveform is connected to the end of the integrated waveform in the high state.

In a case where the state of the threshold discrimination unit 104 is the high state, the logarithmic waveform has a shape having the rising part described above and a falling part. When the state of the threshold discrimination unit 104 becomes the low state, the logarithmic waveform has a shape in which the logarithmic waveform in the high state is inverted.

The waveform signal stored in the lookup table 101 is not limited to the logarithmic waveform, the differentiated waveform, and the integrated waveform described above, and may have any waveform as long as the waveform changes in shape with time.

Refer back to FIG. 1. The random variable generation unit 102 generates a random variable. The random variable is a numerical value randomly selected within a predetermined numerical range, for example. The random variable generation unit 102 determines a random variable in synchronization with the clock signal and inputs the random variable to the computation unit 103.

The computation unit 103 imparts fluctuation to the waveform signal based on the waveform signal read from the lookup table 101, the random variable generated by the random variable generation unit 102, and a feedback signal. Hereinafter, the signal generated by the computation unit 103 is referred to as "fluctuating signal". Here, by adding the waveform signal, the random variable, and the feedback signal, the computation unit 103 generates a fluctuating signal in which fluctuation is imparted to the waveform signal. Specifically, the computation unit 103 sequentially reads the sample values of the waveform signal from the lookup table 101 in synchronization with the clock signal, and adds the random variable and the feedback signal to the read sample values. Due to this, fluctuation is imparted to the signal in which the waveform signal and the feedback signal are added. The fluctuating signal is input to the threshold discrimination unit 104 and is also input to the light emitter 30 as a first output signal.

Furthermore, when the threshold discrimination unit 104 notifies that a control signal indicating that the fluctuating signal falls below a first threshold, the computation unit 103 may impart the inverted waveform signal with fluctuation by sequentially reading, from the head, the waveform signal stored in the lookup table 101, and adding the inverted waveform signal in which the read waveform signal is inverted, the random variable, and the feedback signal. On the other hand, when the threshold discrimination unit 104 notifies that a control signal indicating that the fluctuating signal exceeds a second threshold, the computation unit 103 may sequentially read, from the head, the waveform signal stored in the lookup table 101, and impart the waveform signal with fluctuation based on the read waveform signal, random variable, and feedback signal. Due to this, the inverted waveform signal can be generated without storing the inverted waveform signal in the lookup table 101.

Note that the computation unit 103 may generate the fluctuating signal by subtraction processing, multiplication processing, or division processing instead of addition processing.

An example of the subtraction processing is processing of subtracting the feedback signal and the random variable from the waveform signal, or processing of subtracting the random variable from a signal in which the feedback signal is added to the waveform signal. An example of the multiplication processing is processing of multiplying the waveform signal by each of the feedback signal and the random variable. An example of the division processing is processing of dividing the waveform signal by each of the feedback signal and the random variable.

The fluctuating signal is input to the threshold discrimination unit 104, and is also input to the light emitter 30 as a first output signal. The light emitter 30 is an example of the output device.

The threshold discrimination unit 104 generates a pulse signal by comparing the fluctuating signal output from the computation unit 103 with a predetermined threshold. The threshold includes a first threshold and a second threshold larger than the first threshold. The first threshold is a threshold used when the fluctuating oscillator 1 is in the high state, and the second threshold is a threshold used when the fluctuating oscillator 1 is in the low state. When determining that the fluctuating signal has fallen below the first threshold in a case where the fluctuating oscillator 1 is in the high state, the threshold discrimination unit 104 sets the pulse signal to the low state. Due to this, the fluctuating oscillator 1 enters the low state. On the other hand, when determining that the fluctuating signal has exceeded the second threshold in a case where the fluctuating oscillator 1 is in the low state, the threshold discrimination unit 104 sets the pulse signal to the high state. Due to this, the fluctuating oscillator 1 enters the high state. Use of the first threshold and the second threshold can give hysteresis to the fluctuating oscillator 1.

The threshold discrimination unit 104 is only required to notify the computation unit 103 of a control signal indicating the switching when the fluctuating oscillator 1 is switched from the high state to the low state, and to notify the computation unit 103 of a control signal indicating the switching when the fluctuating oscillator 1 is switched from the low state to the high state. This enables the computation unit 103 to recognize that the fluctuating oscillator 1 has been switched to the low state or the high state. The pulse signal output from the threshold discrimination unit 104 is input to the intensity adjustment unit 105.

In a case where there is one threshold, the threshold discrimination unit 104 only needs to set the pulse signal to the high state when the fluctuating signal exceeds the threshold, and to set the pulse signal to the low state when the fluctuating signal falls below the threshold.

The intensity adjustment unit 105 adjusts the intensity of the pulse signal, inputs the adjusted pulse signal as a feedback signal to the computation unit 103 via the feedback loop 107, and inputs the adjusted pulse signal as a second output signal to the infrared light emitter 40. For example, the intensity adjustment unit 105 is only required to adjust the intensity of the feedback signal by multiplying the feedback signal by a predetermined gain. As the predetermined gain, a predetermined value for giving the feedback signal intensity necessary for causing the fluctuating oscillator 1 to oscillate at a target frequency can be adopted. Note that the intensity adjustment unit 105 may be configured to be able to adjust this predetermined gain from the outside.

The acquisition unit 106 performs predetermined computation on a sensing signal sensed by the sensor 20, and inputs the computed sensing signal to the computation unit 103. The acquisition unit 106 is only required to adjust the level of the sensing signal, for example, by multiplying the sensing signal by a predetermined gain. For example, when the fluctuating oscillator 1 is operated so as to be synchronized with another fluctuating oscillator 1, a predetermined appropriate value in order to achieve this synchronization is adopted as the gain.

The clock signal generator 108 includes, for example, an oscillation circuit, and generates a clock signal that determines an operation clock of the processor 10. The clock setter 109 sets the frequency of the clock signal generated by the clock signal generator 108. The clock setter 109 includes, for example, a frequency divider circuit and a setting unit for setting the frequency division number of the frequency divider circuit, and adjusts the frequency of the clock signal by dividing the clock signal generated by the clock signal generator 108 by the frequency division number set by the setting unit. This setting unit is configured to be able to set the frequency division number according to an instruction from the outside.

The sensor 20 includes a photodiode having sensitivity to infrared light, for example, senses light emitted by the infrared light emitter 40 of the other fluctuating oscillator 1, and generates a digital sensing signal indicating a sensing result.

The light emitter 30 includes, for example, a light-emitting diode, and emits light according to the first output signal. The first output signal is a signal to which fluctuation is given based on the waveform signal stored in the lookup table 101. Therefore, the light emitter 30 emits light with intensity according to the waveform indicated by the waveform signal. Furthermore, the first output signal is an oscillation signal of the fluctuating oscillator 1, and this oscillation signal fluctuates with 1/f fluctuation. Therefore, the light emitter 30 can flicker with 1/f fluctuation.

The infrared light emitter 40 includes a light-emitting diode that emits infrared light, for example, and emits infrared light according to the second output signal. This infrared light is received by the sensor 20 of the fluctuating oscillator 1 disposed at a subsequent stage. This enables the fluctuating oscillator 1 in the subsequent stage to cause the light emitter 30 to emit light in synchronization with the fluctuating oscillator 1 in a preceding stage. Since the second output signal is transmitted to the fluctuating oscillator 1 in the subsequent stage by infrared light, the fluctuating oscillator 1 in the subsequent stage can be operated without being affected by ambient light. The infrared light emitter 40 is an example of the output device.

FIG. 2 is a waveform chart explaining the operation of the fluctuating oscillator 1. An outline of the processing of the fluctuating oscillator 1 will be described below with reference to FIG. 2. In the various waveform charts illustrated in FIG. 2, the vertical axis represents voltage, and the horizontal axis represents time. Note that in the example of FIG. 2, illustration of the sensing signal input from the sensor 20 is omitted. In FIG. 2, the waveform chart in the upper left part illustrates the waveform signal 201 stored in the lookup table 101. In this example, the logarithmic waveform described above is illustrated as the waveform signal 201. The waveform chart in the left middle part is a waveform chart illustrating a random variable 202 generated by the random variable generation unit 102. The waveform chart in the lower left part illustrates a feedback signal 203. In this example, since the pulse signal in the high state is output from the threshold discrimination unit 104, the feedback signal 203 in the high state is illustrated.

The waveform signal 201, the random variable 202, and the feedback signal 203 are input to the computation unit 103 in synchronization with the clock signal. The computation unit 103 generates and inputs, to the threshold discrimination unit 104, a fluctuating signal by adding the waveform signal 201, the random variable 202, and the feedback signal 203 in synchronization with the clock signal.

The waveform chart at the center indicates a fluctuating signal 204. The fluctuating signal 204 is a signal in which fluctuation by the random variable 202 is imparted to the waveform signal 201 offset with the intensity of the feedback signal. At timing t1, the fluctuating signal 204 falls below a first threshold Vth1. Therefore, the threshold discrimination unit 104 changes the pulse signal from the high state to the low state. The waveform chart in the lower right part illustrates a pulse signal 206 output from the threshold discrimination unit 104. As illustrated in this waveform chart, it is indicated that the pulse signal 206 has been switched from the high state to the low state at timing U. Due to this, the fluctuating oscillator 1 changes from the high state to the low state.

At this time, the threshold discrimination unit 104 notifies the computation unit 103 of a control signal indicating that the fluctuating oscillator 1 has been switched to the low state. Upon receiving this control signal, the computation unit 103 reads the waveform signal 201 from the head sample value. The waveform chart in the upper right part illustrates the waveform signal 201 processed by the computation unit 103 according to the switching of the state of the fluctuating oscillator 1. At timing t1, the fluctuating signal falls below the first threshold Vth1. Therefore, the computation unit 103 stops reading the waveform signal 201 in the middle of the first cycle and starts reading the waveform signal 201 from the head sample value. Due to this, reading of the waveform signal 201 of the second cycle is started. Since the fluctuating oscillator 1 is in the low state in the second cycle, the computation unit 103 generates an inverted waveform signal 205 by multiplying the waveform signal 201 by minus 1. Then, the computation unit 103 generates the fluctuating signal by adding the random variable 202 and the feedback signal to the inverted waveform signal 205.

At timing t2, the fluctuating signal generated based on the inverted waveform signal 205 exceeds a second threshold Vth2. Therefore, the threshold discrimination unit 104 switches the pulse signal from the low state to the high state. At this time, the threshold discrimination unit 104 notifies the computation unit 103 of a control signal indicating that the state has been switched from the low state to the high state. Upon receiving this control signal, the computation unit 103 stops reading the waveform signal 201 in the second cycle and starts reading the waveform signal 201 from the head sample value. Due to this, reading of the waveform signal 201 of the third cycle is started. Since the fluctuating oscillator 1 is in the high state at the third cycle, the computation unit 103 generates the fluctuating signal based on the waveform signal 201. Thereafter, these are repeated, and the fluctuating oscillator 1 oscillates. In the waveform signal 201, the feedback signal 203, and the fluctuating signal 204 of FIG. 2, waveforms after timing t1 are omitted.

Figure 4:
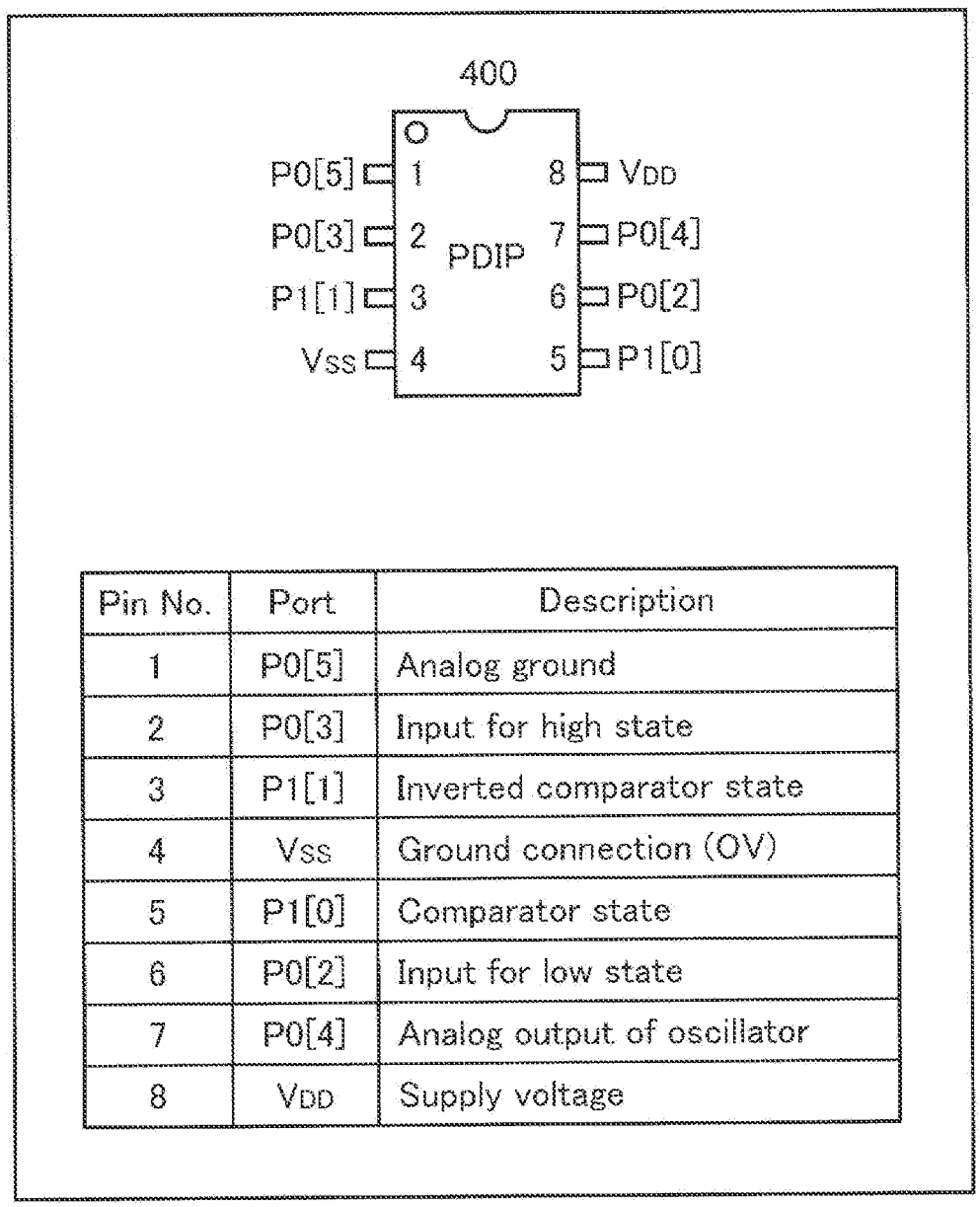
FIG. 4 is an external view of an integrated circuit mounted with a fluctuating oscillator.

FIG. 4 is an external view of an integrated circuit 400 mounted with the fluctuating oscillator 1. In the integrated circuit 400, each block of the processor 10 illustrated in FIG. 1 is integrated, and the sensor 20, the light emitter 30, and the infrared light emitter 40 are not integrated. The integrated circuit 400 includes eight pins indicated by pin numbers "1" to "8". The lower side of FIG. 4 presents a table in which the pins "1" to "8", ports corresponding to the respective pins, and signals flowing through the respective ports are associated.

In each port, "0" following P indicates that the signal flowing through the port is an analog signal, and "1" following P indicates that the signal flowing through the port is a digital signal.

Hereinafter, only main pins will be briefly described. The pin "4" is a VSS port to which a ground voltage is input. Here, the ground voltage is 0 V. The pin "5" is a P1 [0] port to which the state of a comparator is output. The state of the comparator output here is the second output signal output from the intensity adjustment unit 105. The pin "7" is a P0 [4] port that outputs an analog signal. The analog signal output here is the first output signal output from the computation unit 103. The pin "8" is a VDD port to which a supply voltage is input. The supply voltage is drive voltage of the integrated circuit 400.

Figure 5:
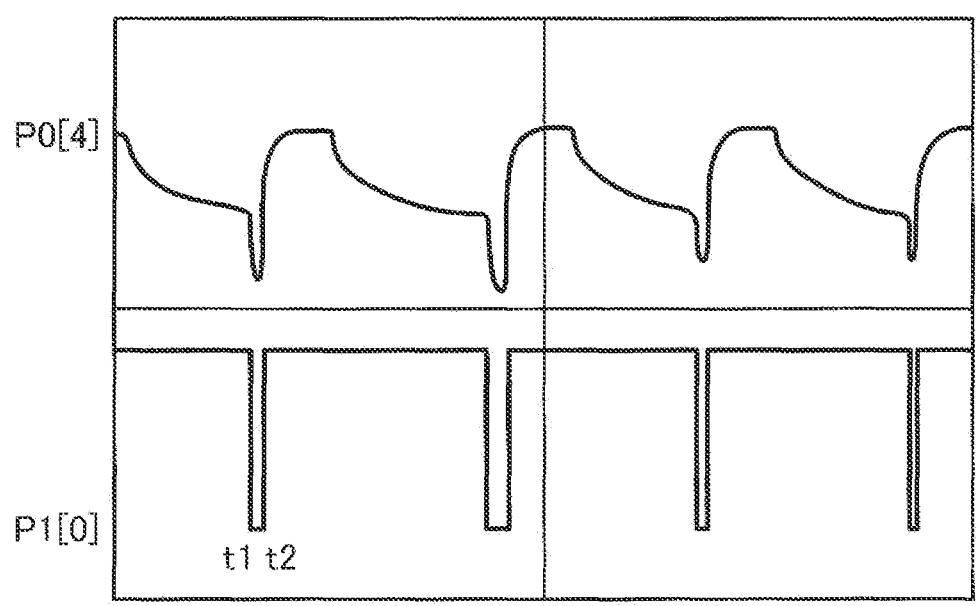
FIG. 5 is a waveform chart of a first output signal and a second output signal that are output from a port P0 [4] and a port P1 [0] illustrated in FIG. 4.

FIG. 5 is a waveform chart of the first output signal and the second output signal output from the port P0 [4] and the port P1 [0] illustrated in FIG. 4. In the example of FIG. 5, the waveform signal stored in the lookup table 101 is a logarithmic waveform.

Since the first output signal (fluctuating signal) flowing through the port P0 [4] falls below the first threshold Vth1 at timing t1, the second output signal flowing through the port P1 [0] is switched from the high state to the low state. Due to this, the fluctuating oscillator 1 switches from the high state to the low state. Since the fluctuating oscillator 1 enters the low state, the computation unit 103 starts reading from the head of the waveform signal from the lookup table 101 and inverts the read sampling value. Due to this, the first output signal flowing through the port P0 [4] has a shape in which the first output signal in the high state is inverted.

Since the first output signal generated based on the waveform signal has exceeded the second threshold Vth2 at timing t2 immediately after the switching to the low state, the second output signal flowing through the port P1 [0] has been switched from the low state to the high state. Thereafter, this processing is repeated, and the first output signal and the second output signal as illustrated in FIG. 5 are output.

Figure 6:
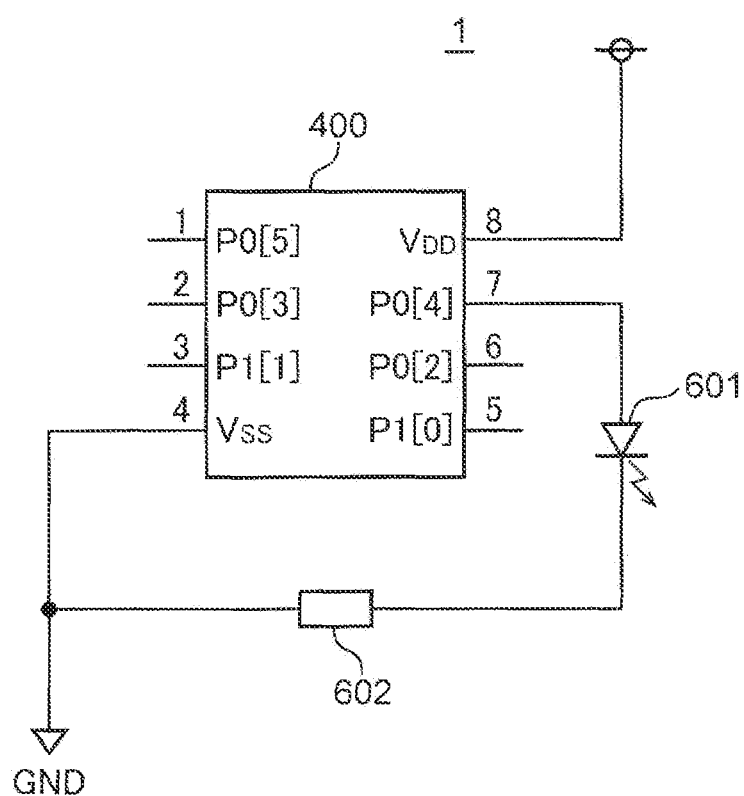
FIG. 6 is a view illustrating a mounting example of a single fluctuating oscillator.

FIG. 6 is a view illustrating a mounting example of the single fluctuating oscillator 1. In this mounting example, the fluctuating oscillator 1 includes the integrated circuit 400 and a light-emitting diode 601 illustrated in FIG. 4. The light-emitting diode 601 is an example of the light emitter 30 illustrated in FIG. 1. The light-emitting diode 601 is connected to the port P0 [4], to which the first output signal is input, and emits visible light.

A supply voltage is input to the VDD port. The VSS port is connected to the ground GND. A resistor 602 is provided between the light-emitting diode 601 and the ground GND. The resistor 602 is a current-limiting resistor of the light-emitting diode 601. In the fluctuating oscillator 1 illustrated in FIG. 6, the light-emitting diode 601 flickers in accordance with the first output signal indicated by the port P0 [4] in FIG. 5. As illustrated in FIG. 5, the period during which the fluctuating oscillator 1 is in an on state fluctuates. This fluctuation can have characteristics of 1/f fluctuation. Therefore, the light-emitting diode 601 can achieve natural flickering that allows a human to feel comfortable as if a firefly.

Figure 7:
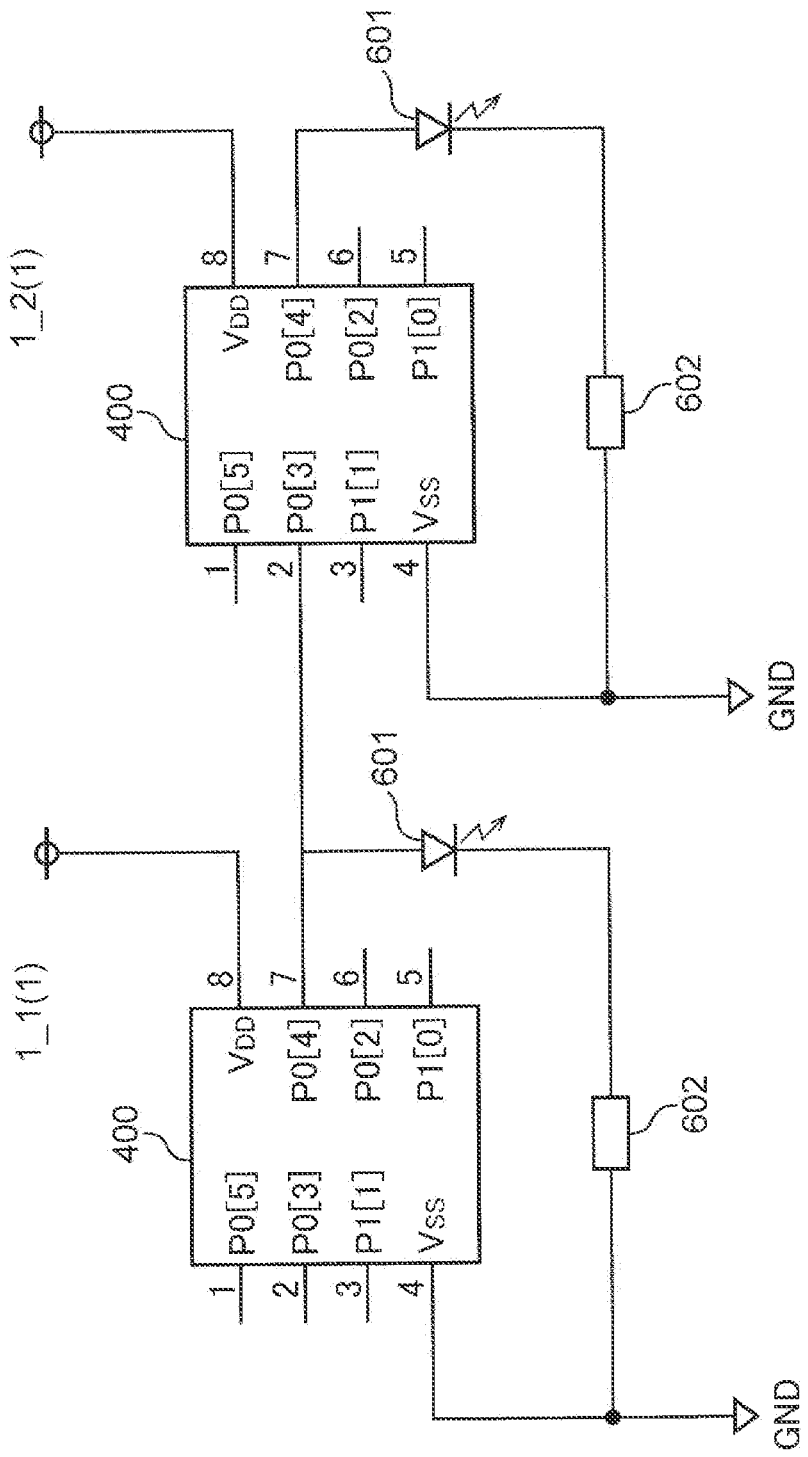
FIG. 7 is a view illustrating a mounting example of two fluctuating oscillators.

FIG. 7 is a view illustrating a mounting example of the two fluctuating oscillators 1. In this mounting example, the two fluctuating oscillators 1 are connected. Here, the left fluctuating oscillator 1 is given a reference numeral 1_1, and the right fluctuating oscillator 1 is given a reference numeral 1_2 to distinguish the both. The basic configurations of the fluctuating oscillator 1_1 and the fluctuating oscillator 1_2 are the same as those of the fluctuating oscillator 1 illustrated in FIG. 6. However, in the example of FIG. 7, the P0 [4] port of the fluctuating oscillator 1_1 is connected to the P0 [3] port of the fluctuating oscillator 1_2. Assuming that the fluctuating oscillator 1 illustrated in FIG. 1 is the fluctuating oscillator 1_2, this connection only needs to be considered that the fluctuating oscillator 1_1 is adopted as the sensor 20 and the first output signal of the fluctuating oscillator 1_1 is adopted as the sensing signal to be input from the sensor 20 to the acquisition unit 106. Due to this, the fluctuating oscillator 1_1 and the fluctuating oscillator 1_1 oscillate in synchronization, and the light-emitting diode 601 of the fluctuating oscillator 1_1 flickers in synchronization with the light-emitting diode 601 of the fluctuating oscillator 1_2. In FIG. 7, the port P0 [4] of the fluctuating oscillator 1_1 may be connected to the port P0 [2] of the fluctuating oscillator 1_2.

Figure 8:
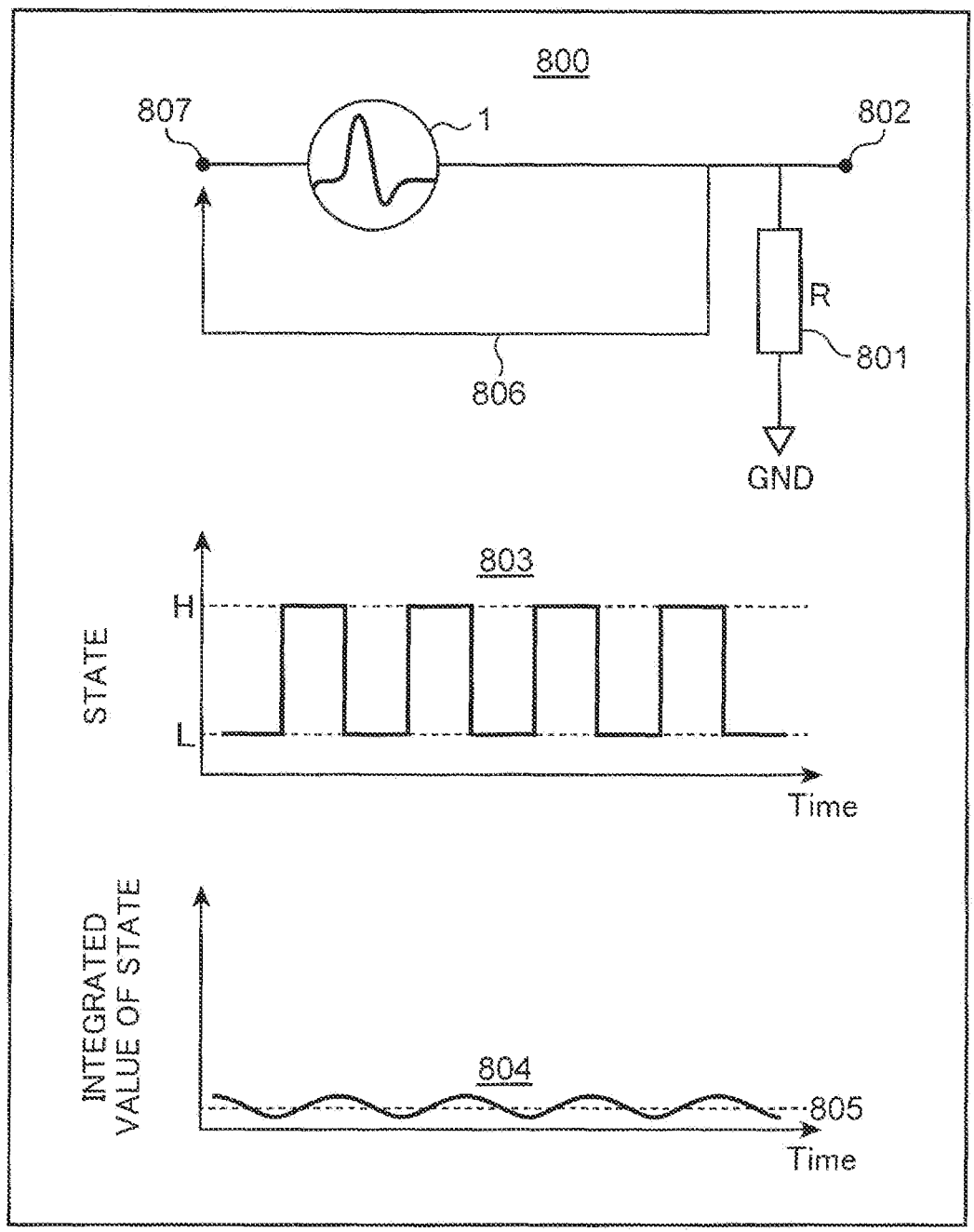
FIG. 8 is a view illustrating an example of temporal transition of a state of the fluctuating oscillator in a case where no sensor is connected.

FIG. 8 is a view illustrating an example of temporal transition of the state of the fluctuating oscillator 1 in a case where the sensor 20 is not connected. In FIG. 8, the upper view is a circuit diagram 800 illustrating an example of the fluctuating oscillator 1 to which no sensor is connected. The middle view is a waveform chart 803 illustrating the temporal transition of the state of the fluctuating oscillator 1 illustrated in the circuit diagram 800. The lower view is a waveform chart 804 illustrating the temporal transition of an integrated value of the state of the fluctuating oscillator 1 illustrated in the circuit diagram 800. In the example of the circuit diagram 800 of FIG. 8, in the fluctuating oscillator 1, a resistor 801 is connected between an output terminal 802 and the ground GND. The output signal from the fluctuating oscillator 1 is fed back to an input terminal 807 via a feedback loop 806. In this figure, the feedback loop 806 is illustrated outside the fluctuating oscillator 1, but in practice, this feedback loop 806 indicates the feedback loop 107 illustrated in FIG. 1 included in the fluctuating oscillator 1.

For example, the integrated value in the state illustrated in waveform chart 804 indicates a value when the high state of the fluctuating oscillator 1 is "1" and the low state is "−1" and these values are integrated along the time axis.

When there is no input from the sensor, as illustrated in waveform chart 803, the fluctuating oscillator 1 has its state changed such that the duty ratio between the high state and the low state becomes substantially 50%. Therefore, as illustrated in the waveform chart 804, the integrated value of the state has a triangular waveform that vibrates up and down about an initial value 805. Therefore, in a case of using the integrated value of the state for the position control of the robot, it is possible to achieve a random walk that largely causes the robot to stay at an initial position while locally causing the robot to repeatedly move, for example, in the left-right direction or the front-rear direction about the initial position corresponding to the initial value 805.

Figure 9:
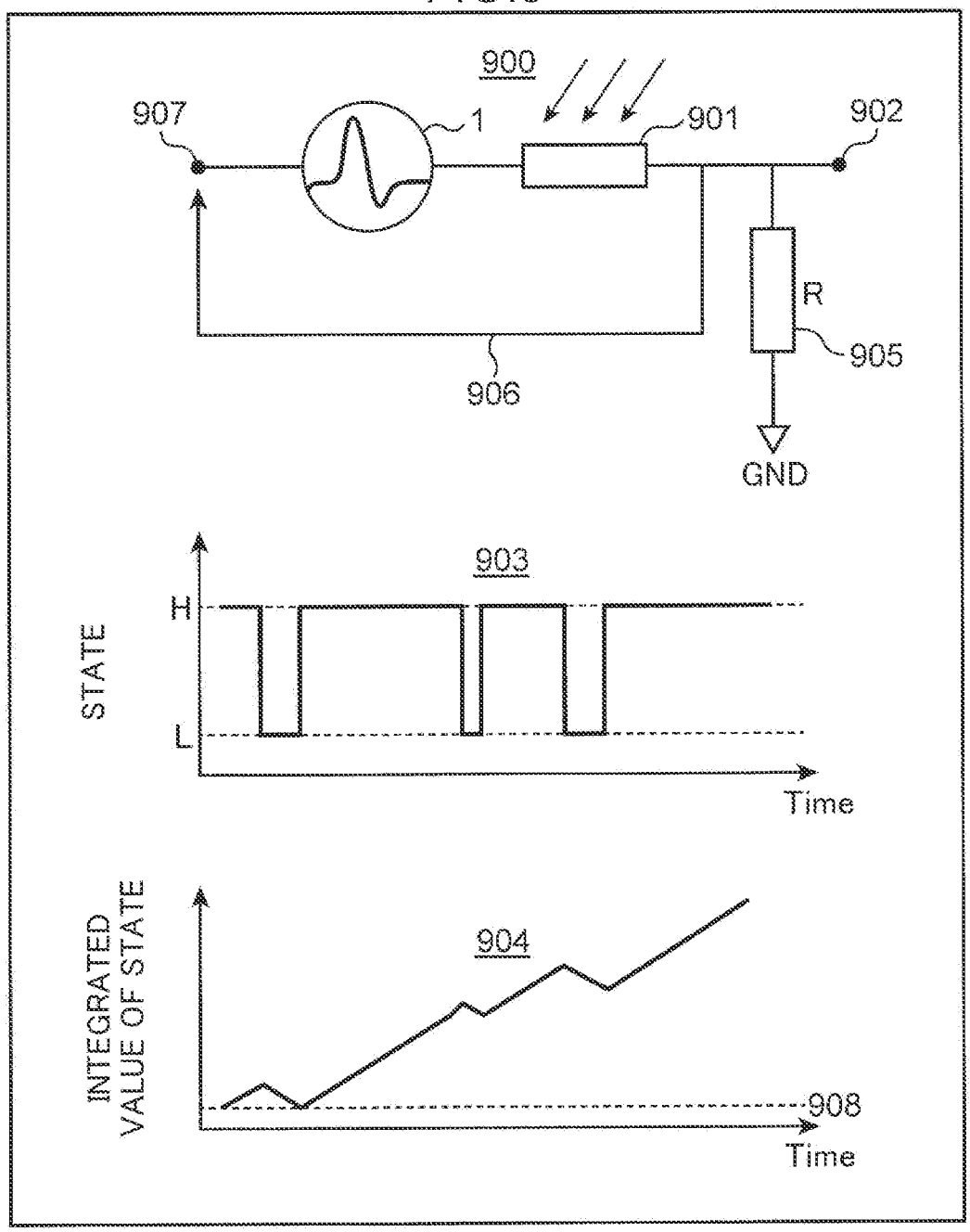
FIG. 9 is a view illustrating an example of temporal transition of a state of the fluctuating oscillator in a case where a sensor is connected.

FIG. 9 is a view illustrating an example of temporal transition of the state of the fluctuating oscillator 1 in a case where a sensor 901 is connected. In FIG. 9, the upper view is a circuit diagram 900 illustrating an example of the fluctuating oscillator 1 in a case where the sensor 901 is connected. The middle view is a waveform chart 903 illustrating the temporal transition of the state of the fluctuating oscillator 1 illustrated in the circuit diagram 900. The view is a waveform chart 904 illustrating the temporal transition of an integrated value of the state of the fluctuating oscillator 1 illustrated in the circuit diagram 900.

In the example of the circuit diagram 900, the fluctuating oscillator 1 is provided with a resistor 905 between an output terminal 902 and the ground GND. The sensor 901 is a photosensor, and is connected between the fluctuating oscillator 1 and the output terminal 902. Here, the sensing signal of the sensor 901 is fed back to an input terminal 907 via a feedback loop 906. Similarly to the feedback loop 806 of FIG. 8, this feedback loop 906 also indicates the feedback loop 107 illustrated in FIG. 1 included in the fluctuating oscillator 1.

When the sensor 901 is present, as illustrated in the waveform chart 903, the fluctuating oscillator 1 has a bias in the time average between the high state and the low state. In this waveform chart 903, the time average between the high state and the low state is biased to the high state side. Therefore, as illustrated in the waveform chart 904, the integrated value of the state largely increases from an initial value 908 with the lapse of time, although slightly decreases to the initial value 908 side. Therefore, for example, in a case of using the integrated value of the state for the position control of the robot, it becomes possible to move the robot according to the light to be emitted.

As described above, according to the fluctuating oscillator 1 according to the present embodiment, since the lookup table 101 for storing the waveform signal in advance is provided, the waveform signal of the ideal transient response signal required in the conventional fluctuating oscillator can be stored in advance in the lookup table 101. This makes it possible to obtain an ideal transient response signal without performing troublesome work such as adjusting the circuit parameter of the transient response unit including an integrator circuit or a differentiator circuit in order to obtain the ideal transient response signal.

Furthermore, according to this configuration, the random variable generator, the lookup table, the computation unit, the threshold discrimination unit, and the feedback loop include the processor including a digital circuit. This eliminates the need for the transient response unit including a differentiator circuit or an integrator circuit adopted in the conventional fluctuating oscillator, thereby making it possible to reduce the scale of the circuit configuration. Furthermore, since the fluctuating oscillator includes such processor, the fluctuating oscillator 1 can be configured by a one-chip integrated circuit. Furthermore, it becomes unnecessary to separately provide a noise generator such as a function generator, and the circuit configuration can be further reduced in scale.

Second Embodiment

Next, the second embodiment of the present invention will be described. The second embodiment relates to a robot controlled using the fluctuating oscillator 1 described in the first embodiment.

Figure 10:
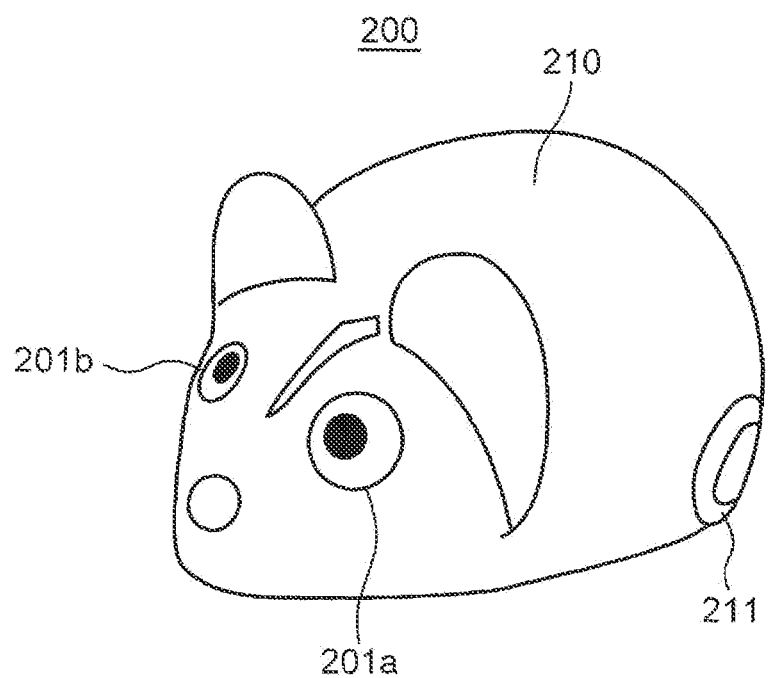
FIG. 10 is an external view of a robot according to a second embodiment.

FIG. 10 is an external view of a robot 200 according to the second embodiment. The robot 200 is a rat-like mobile robot that simulates a rat. The robot 200 includes a housing 210, a photosensor 201a, a photosensor 201b, and a pair of wheels 211.

The housing 210 is made of a translucent material. The housing 210 has a form simulating ears, eyes, a nose, a body, and the like of a rat. The photosensor 201a is provided at a position corresponding to the left eye of the rat in the housing 210. The photosensor 201b is provided at a position corresponding to the right eye of the rat in the housing 210. The photosensors 201a and 201b are sensors having sensitivity to visible light. The pair of wheels 211 is provided at a position corresponding to the legs of the rat in the housing 210.

Figure 11:
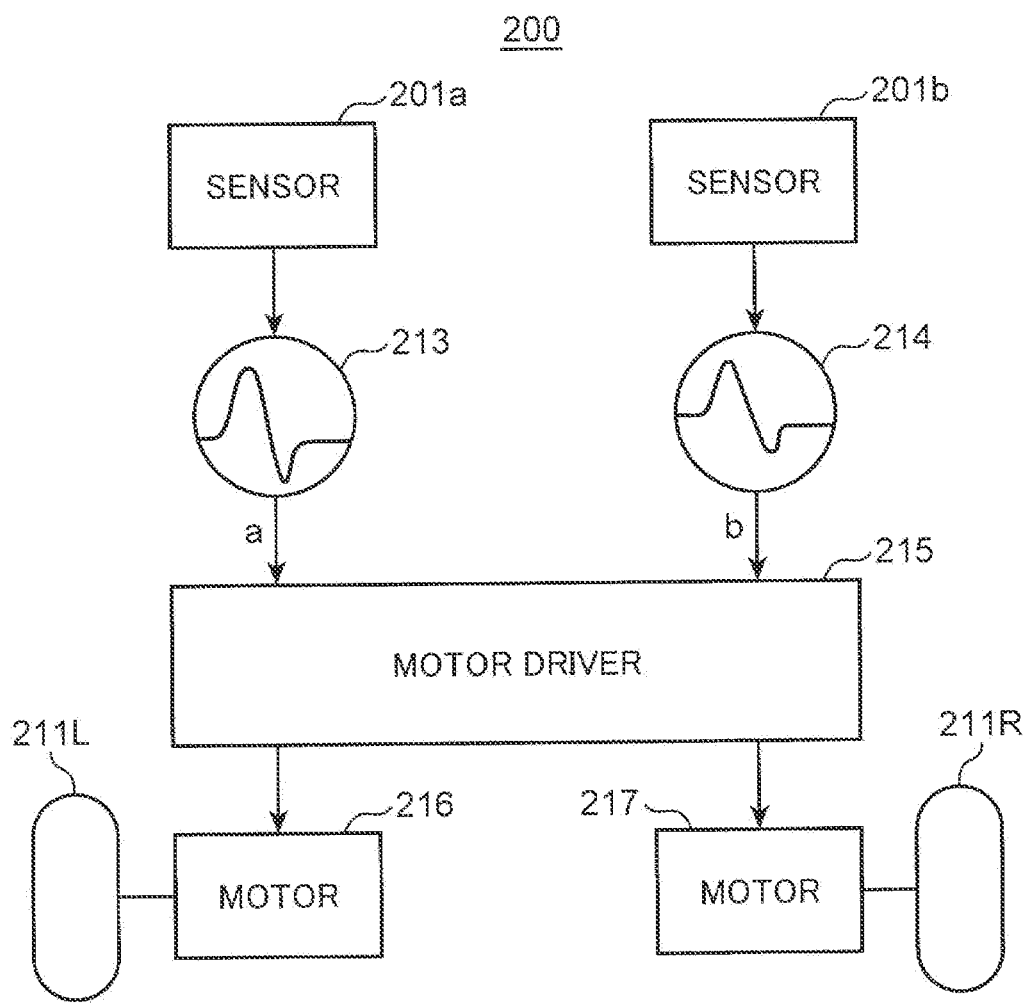
FIG. 11 is a block diagram of the robot illustrated in FIG. 10.

FIG. 11 is a block diagram of the robot 200 illustrated in FIG. 10. The robot 200 includes fluctuating oscillators 213 and 214, a motor driver 215, and motors 216 and 217, in addition to the photosensors 201a and 201b and the pair of wheels 211 described above. In FIG. 11, the pair of wheels 211 is represented as a wheel 211L and a wheel 211R. The wheel 211L and the wheel 211R are examples of the first wheel and the second wheel. The motor 216 and the motor 217 are examples of the first motor and the second motor.

Each of the fluctuating oscillators 213 and 214 includes the processor 10 of the fluctuating oscillator 1 illustrated in FIG. 1. The fluctuating oscillator 213 receives the sensing signal detected by the photosensor 201a, and oscillates while being affected by the sensing signal. The fluctuating oscillator 213 inputs an output signal a to the motor driver 215. The output signal a is the second output signal whose gain is adjusted by the intensity adjustment unit 105 based on the pulse signal output from the threshold discrimination unit 104 illustrated in FIG. 1. Therefore, the output signal a includes the high state and the low state.

The fluctuating oscillator 214 receives the sensing signal detected by the photosensor 201b, and oscillates while being affected by the sensing signal. The fluctuating oscillator 214 inputs an output signal b to the motor driver 215. The output signal b is the second output signal similarly to the output signal.

The motor driver 215 includes, for example, an electric circuit, and determines a predetermined operation pattern of the robot 200 according to a combination of the state of the output signal a and the state of the output signal b. The motor driver 215 inputs, to the motor 216 and the motor 217, a control signal for operating the robot 200 with the determined operation pattern. Hereinafter, the control signal of the motor 216 is referred to as first control signal, and the control signal input to the motor 217 is referred to as second control signal.

The motor 216 drives the wheel 211L in accordance with the first control signal from the motor driver 215. The motor 217 drives the wheel 211R in accordance with the second control signal from the motor driver 215. The wheel 211L is a left wheel of the robot 200, and the wheel 211R is a right wheel of the robot 200.

FIG. 12 is a view illustrating a logical value table T1 used when the motor driver 215 determines the operation pattern of the robot 200. The logical value table T1 includes a plurality of combinations of the state of the output signal a and the state of the output signal b and the operation pattern of the robot 200 corresponding to each combination.

In this example, when the states of both the output signals a and b are "L (low state)", an operation pattern of "stop" is associated. When the state of the output signal a is "H (high state)" and the state of the output signal b is "L", an operation pattern of "right turning" is associated. When the state of the output signal a is "L" and the state of the output signal b is "H", an operation pattern of "left turning" is associated. When the states of both the output signals a and b are "H", an operation pattern of "break" is associated.

The stop is to stop the rotation of the wheels 211L and 211R to bring the wheels 211L and 211R into a locked state.

The right turning is an operation of turning the robot 200 rightward as viewed from above. The left turning is an operation of turning the robot 200 leftward as viewed from above. The break is an operation pattern of making the wheels 211L and 211R of the robot 200 idle.

When determining the operation pattern to be "stop", the motor driver 215 stops output of the first control signal and the second control signal to the motor 216 and the motor 217. Due to this, in the robot 200, the wheel 202L and the wheel 202R enter the locked state. When determining the operation pattern to be "right turning", the motor driver 215 generates and inputs, to the motor 216 and the motor 217, the first control signal and the second control signal for making the rotation speed of the wheel 211L faster than the rotation speed of the wheel 211R. When determining the operation pattern to be "left turning", the motor driver 215 generates and inputs, to the motor 216 and the motor 217, the first control signal and the second control signal for making the rotation speed of the wheel 211R faster than the rotation speed of the wheel 211L.

When determining the operation pattern to be "break", the motor driver 215 generates and inputs, to the motors 216 and 217, a control signal for making the wheels 211L and 202R idle.

As described above, according to the present embodiment, the operation pattern of the robot 200 can be changed according to light. Furthermore, according to the present embodiment, it is possible to provide a mobile robot that operates in a predetermined operation pattern according to a combination of the states of the second output signals of the fluctuating oscillators 1.

Note that the operation pattern described in the logical value table T1 is merely an example, and another operation pattern may be adopted, for example. Examples of other operation patterns include forward movement and backward movement. Furthermore, the association between the combination of the states of the output signal a and the output signal b and the operation pattern is not limited to those described in the logical value table T1 described above, and other association may be adopted. For example, although "stop" is associated with the combination of "L" and "L", "stop" may be associated with the combination of "H" and "H".

In the example of FIG. 11, the robot 200 includes the two fluctuating oscillators 1, but this is an example, and the number of fluctuating oscillators 1 may be one or three or more.

Third Embodiment

Figure 13:
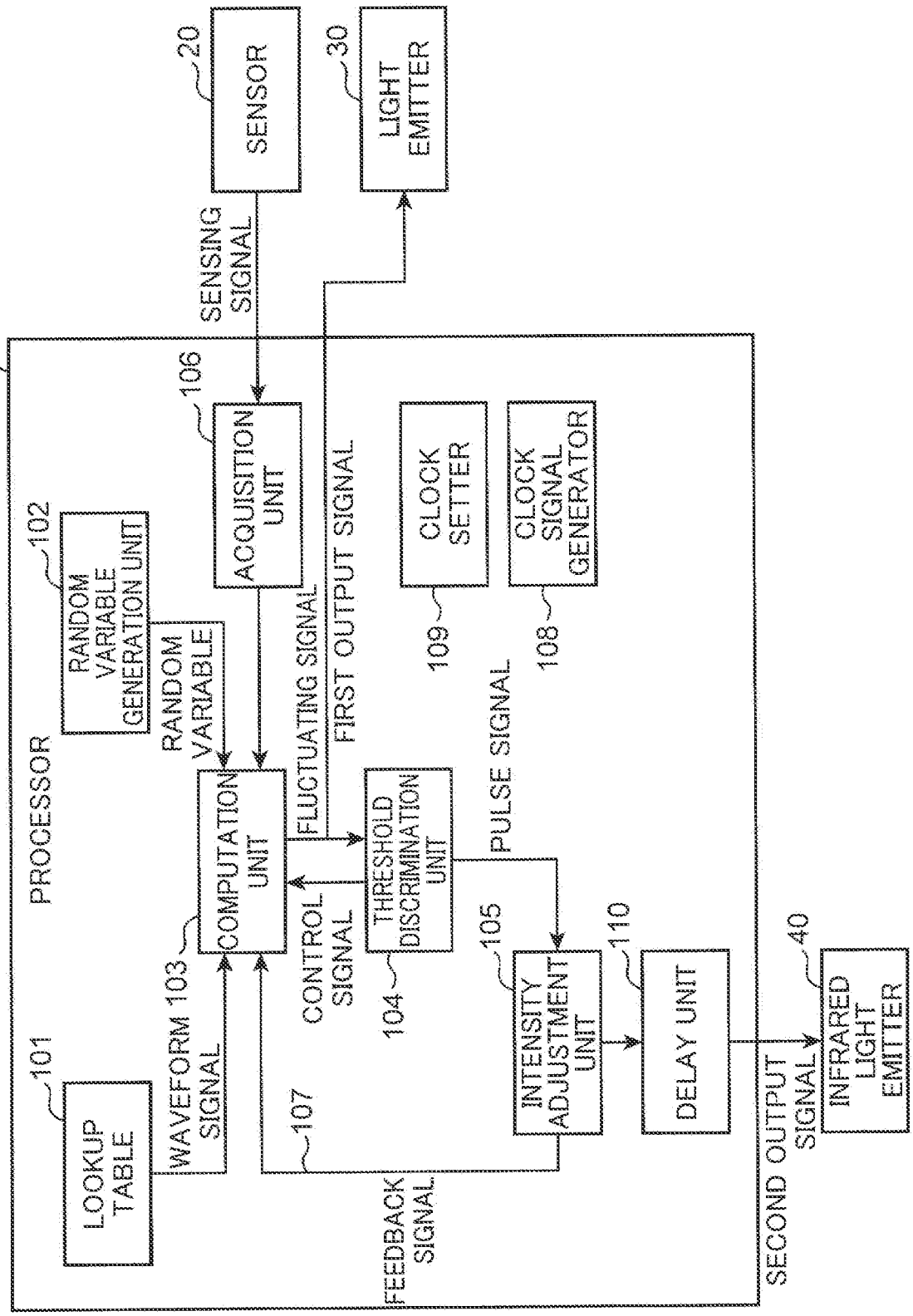
FIG. 13 is a block diagram of a fluctuating oscillator according to a third embodiment.

The third embodiment is characterized in further providing the fluctuating oscillator 1 of the first embodiment with a delay unit 110. FIG. 13 is a block diagram of a fluctuating oscillator 1A according to the third embodiment. A processor 10A is further provided with the delay unit 110. The delay unit 110 delays and outputs, to the infrared light emitter 40, the phase of the second output signal output from the intensity adjustment unit 105 by a predetermined time.

The intention of providing the delay unit 110 is as follows. For example, a lighting unit in which N (integer of 2 or greater) fluctuating oscillators 1 described in the first embodiment are connected in a ring shape is assumed. Connecting the N fluctuating oscillators 1 in a ring shape is to arrange the fluctuating oscillators 1 so as to sequentially cause the second to Nth fluctuating oscillators 1, and further cause also the Nth to first fluctuating oscillators 1, to cause the sensor 20 of the second fluctuating oscillator 1 to receive the infrared light emitted by the infrared light emitter 40 of the first fluctuating oscillator 1. Due to this, the second output signal of the first fluctuating oscillator 1 is sequentially propagated to the second, third, . . . , and Nth fluctuating oscillators 1, and then further returned to the first fluctuating oscillator 1.

In the lighting unit configured as described above, each fluctuating oscillator 1 flickers asynchronously at first, but eventually flickers synchronously as the propagation of the second output signal is repeated. In a case of not delaying the phase of the second output signal output from each fluctuating oscillator 1, the turn-on timing and the turn-off timing of each fluctuating oscillator 1 become substantially the same timing. This prevents the lighting unit from becoming able to achieve display performance in which the light emitted from each fluctuating oscillator 1 sequentially propagates in a ring shape.

On the other hand, the fluctuating oscillator 1A including the delay unit 110 constitutes the lighting unit. In this case, the phase of the second output signal of each fluctuating oscillator 1A is delayed and propagated to the fluctuating oscillator 1A in the subsequent stage, and the turn-on timing and the turn-off timing of each fluctuating oscillator 1 are shifted with respect to the turn-on timing and the turn-off timing of the fluctuating oscillator 1 in the preceding stage by a predetermined time. This enables the lighting unit to achieve display performance in which the light emitted from each fluctuating oscillator 1A sequentially propagates in a ring shape.

The lighting unit may include the fluctuating oscillators 1A connected not in a ring shape but in one direction. Being connected in one direction means arranging the fluctuating oscillators 1A so as to cause the second to Nth fluctuating oscillators 1A to cause the sensor 20 of the second fluctuating oscillator 1A to receive the infrared light emitted by the infrared light emitter 40 of the first fluctuating oscillator 1A. Due to this, the second output signal of the first fluctuating oscillator 1 is sequentially propagated to the second, third, . . . , and Nth fluctuating oscillators 1. In this case, each fluctuating oscillator 1A initially flickers asynchronously, but eventually turns on synchronously while shifting the phase by a predetermined time. In this case, the lighting unit can perform display performance in which light is flickered in the order of the Nth to the first fluctuating oscillators 1A by the work of suppression type control, which is a control technique simulating a living creature.

Summary of Embodiments

A fluctuating oscillator according to one aspect of the present invention includes: a processor including a digital circuit, in which the processor includes a random variable generation unit that generates a random variable, a lookup table that stores a waveform signal in advance, a computation unit that imparts fluctuation to the waveform signal based on the waveform signal read from the lookup table, the random variable generated by the random variable generation unit, and a pulse signal to be fed back, a threshold discrimination unit that generates a pulse signal by comparing a fluctuating signal output from the computation unit with a predetermined threshold, and a feedback loop that causes the pulse signal to be fed back to the computation unit.

According to this configuration, since the lookup table for storing the waveform signal in advance is provided, the waveform signal of the ideal transient response signal required in the conventional fluctuating oscillator can be stored in advance in the lookup table. This makes it possible to obtain an ideal transient response signal without performing troublesome work such as adjusting the circuit parameter of the transient response unit including an integrator circuit or a differentiator circuit in order to obtain the ideal transient response signal.

Furthermore, according to this configuration, the random variable generator, the lookup table, the computation unit, the threshold discrimination unit, and the feedback loop include the processor including a digital circuit. This eliminates the need for the transient response unit including a differentiator circuit or an integrator circuit adopted in the conventional fluctuating oscillator, thereby making it possible to reduce the scale of the circuit configuration. Furthermore, since the fluctuating oscillator includes such processor, the fluctuating oscillator can be configured by a one-chip integrated circuit. Furthermore, it becomes unnecessary to separately provide a noise generator such as a function generator, and the circuit configuration can be further reduced in scale.

In the fluctuating oscillator, the waveform signal preferably has a differentiated waveform indicating an output signal of the differentiator circuit, an integrated waveform indicating an output signal of the integrator circuit, or a transient response waveform of the LCR circuit.

According to this configuration, since the waveform signal stored in the lookup table has the differentiated waveform, the integrated waveform, or the transient response waveform of the LCR circuit, the fluctuating oscillator can be operated using a signal based on the differentiated waveform, the integrated waveform, or the transient response waveform of the LCR circuit.

It is preferable that in the fluctuating oscillator, the processor further includes the clock signal generator that generates a clock signal that determines an operation clock of the processor, and a clock setter that sets a frequency of the clock signal, and the computation unit sequentially reads, in synchronization with the clock signal, sample values of waveform signals stored in the lookup table.

According to this configuration, the clock setter that sets the frequency of the clock signal that determines the operation clock of the processor is provided, and the sample values of the waveform signals stored in the lookup table are sequentially read in synchronization with the clock signal. This makes it possible to discretionarily set the frequency of the clock signal by the clock setter and discretionarily set the period of the waveform signal without performing troublesome work such as tuning the time constant of the transient response unit as in the conventional fluctuating oscillator.

It is preferable that in the fluctuating oscillator, the fluctuating oscillator further includes the sensor, the processor further includes the acquisition unit that acquires and inputs, to the computation unit, a sensing signal detected by the sensor, and the computation unit further generates the fluctuating signal based on the sensing signal.

According to this configuration, since the sensing signal detected by the sensor is input to the computation unit and the fluctuating signal is generated by further using the sensing signal, it is possible to cause the fluctuating oscillator to oscillate in synchronization with the sensing signal and possible to sense a weak signal included in the sensing signal.

It is preferable that in the fluctuating oscillator, the fluctuating oscillator further includes the output device that outputs the fluctuating signal or the pulse signal as an output signal, and the sensor detects the output signal from another fluctuating oscillator and inputs, to the computation unit, the output signal as the sensing signal.

According to this configuration, since an output signal from another fluctuating oscillator is sensed by the sensor and is input to the computation unit as a sensing signal, it becomes possible to cause the fluctuating oscillator to be synchronized with the other fluctuating oscillator. Furthermore, it becomes possible to cause the plurality of fluctuating oscillators to be connected in one direction or in a ring shape.

It is preferable that in the fluctuating oscillator, the threshold includes a first threshold and a second threshold, which is larger than the first threshold, when the threshold discrimination unit determines that the fluctuating signal has fallen below the first threshold, the computation unit reads, from head, the waveform signal stored in the lookup table, and, based on an inverted waveform signal in which the waveform signal having been read is inverted, the random variable, and the pulse signal to be fed back, imparts the inverted waveform signal with fluctuation, and when the threshold discrimination unit determines that the fluctuating signal has exceeded the second threshold, the computation unit reads, from the head, the waveform signal stored in the lookup table, and, based on the waveform signal having been read, the random variable, and the pulse signal to be fed back, imparts the waveform signal with fluctuation.

According to this configuration, when it is determined that the fluctuating signal has fallen below the first threshold, the waveform signal is sequentially read from the head, the read waveform signal is inverted to generate the inverted waveform signal, and the inverted waveform signal is imparted with fluctuation. Therefore, it becomes unnecessary to store the inverted waveform signal in the lookup table, and it is possible to suppress consumption of the memory resource by the lookup table. Furthermore, when the fluctuating signal falls below the first threshold and the state of the fluctuating oscillator changes from the high state to the low state, it becomes possible to read the inverted waveform signal from the head, and it becomes possible to achieve an operation similar to that of the analog fluctuating oscillator.

On the other hand, when it is determined that the fluctuating signal has exceeded the second threshold, the waveform signal is read from the head, and the waveform signal is imparted with fluctuation. Therefore, when the state of the fluctuating oscillator changes from the low state to the high state, it becomes possible to read the waveform signal from the head, and it becomes possible to perform an operation similar to that of the analog fluctuating oscillator.

Furthermore, since the first threshold is adopted when the fluctuating oscillator is in the high state, the second threshold is adopted when the fluctuating oscillator is in the low state, and the second threshold is larger than the first threshold, it becomes possible to give hysteresis to the fluctuating oscillator.

It is preferable that in the fluctuating oscillator, the processor further includes the intensity adjustment unit that adjusts the intensity of the pulse signal to be fed back.

According to this configuration, since it is possible to adjust the intensity of the pulse signal to be fed back, it becomes possible to flexibly adjust the parameters of the fluctuating oscillator.

A robot according to another aspect of the present invention is a mobile robot including: a first wheel; a second wheel; a first motor that drives the first wheel; a second motor that drives the second wheel; a plurality of fluctuating oscillators; and a motor driver that determines a predetermined operation pattern of the robot according to a combination of a state of a pulse signal output from each fluctuating oscillator, and generates a first control signal of the first motor and a second control signal of the second motor for moving the robot with the operation pattern having been determined, in which each of the fluctuating oscillators includes the fluctuating oscillator.

According to this configuration, it is possible to provide a mobile robot that operates with a predetermined operation pattern according to the combination of the states of the pulse signals of the fluctuating oscillators.

The invention claimed is:

1. A fluctuating oscillator comprising:
a processor including a digital circuit,
wherein the processor includes
a random variable generation unit that generates a random variable,
a lookup table that stores a waveform signal in advance,
a computation unit that imparts fluctuation to the waveform signal based on the waveform signal read from the lookup table, the random variable generated by the random variable generation unit, and a pulse signal to be fed back,
a threshold discrimination unit that generates a pulse signal by comparing a fluctuating signal output from the computation unit with a predetermined threshold, and
a feedback loop that causes the pulse signal to be fed back to the computation unit.

2. The fluctuating oscillator according to claim 1, wherein the waveform signal has a differentiated waveform indicating an output signal of a differentiator circuit, an integrated waveform indicating an output signal of an integrator circuit, or a transient response waveform of an LCR circuit.

3. The fluctuating oscillator according to claim 1, wherein the processor further includes
a clock signal generator that generates a clock signal that determines an operation clock of the processor, and
a clock setter that sets a frequency of the clock signal, and
the computation unit sequentially reads, in synchronization with the clock signal, sample values of waveform signals stored in the lookup table.

4. The fluctuating oscillator according to claim 1, wherein the fluctuating oscillator further includes a sensor,
the processor further includes an acquisition unit that acquires and inputs, to the computation unit, a sensing signal detected by the sensor, and
the computation unit further generates the fluctuating signal based on the sensing signal.

5. The fluctuating oscillator according to claim 4, wherein the fluctuating oscillator further includes an output device that outputs the fluctuating signal or the pulse signal as an output signal, and
the sensor detects the output signal from another fluctuating oscillator and inputs, to the computation unit, the output signal as the sensing signal.

6. The fluctuating oscillator according to claim 1, wherein the threshold includes a first threshold and a second threshold, which is larger than the first threshold,
when the threshold discrimination unit determines that the fluctuating signal has fallen below the first threshold, the computation unit reads, from head, the waveform signal stored in the lookup table, and, based on an inverted waveform signal in which the waveform signal having been read is inverted, the random variable, and the pulse signal to be fed back, imparts the inverted waveform signal with fluctuation, and
when the threshold discrimination unit determines that the fluctuating signal has exceeded the second threshold, the computation unit reads, from the head, the waveform signal stored in the lookup table, and, based on the waveform signal having been read, the random variable, and the pulse signal to be fed back, imparts the waveform signal with fluctuation.

7. The fluctuating oscillator according to claim 1, wherein the processor further includes an intensity adjustment unit that adjusts an intensity of a pulse signal to be fed back.

8. A mobile robot comprising:
a first wheel;
a second wheel;
a first motor that drives the first wheel;
a second motor that drives the second wheel;
a plurality of fluctuating oscillators; and
a motor driver that determines a predetermined operation pattern of the robot according to a combination of a state of a pulse signal output from each fluctuating oscillator, and generates a first control signal of the first motor and a second control signal of the second motor for moving the robot with the operation pattern having been determined,
wherein each of the fluctuating oscillators includes the fluctuating oscillator according to claim 1.

* * * * *